United States Patent
Zhang et al.

(10) Patent No.: US 6,282,143 B1
(45) Date of Patent: Aug. 28, 2001

(54) MULTI-PORT STATIC RANDOM ACCESS MEMORY DESIGN FOR COLUMN INTERLEAVED ARRAYS

(75) Inventors: Kevin Zhang, Portland, OR (US); John Wuu, Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/084,689

(22) Filed: May 26, 1998

(51) Int. Cl.[7] .................................................... G11C 8/00
(52) U.S. Cl. .................. 365/230.05; 365/189.08
(58) Field of Search ................ 365/189.04, 51, 365/63, 189.08, 154, 230.05

(56) References Cited

U.S. PATENT DOCUMENTS 5,477,489 * 12/1995 Wiedmann ..................... 365/189.04
5,914,906 * 6/1999 Iadanza et al. .................. 365/230.05

* cited by examiner

Primary Examiner—David Nelms
Assistant Examiner—M. Tran

(57) ABSTRACT

A static random-access memory (SRAM) comprises multi-port storage cells with built-in column-interleave selection circuitry which allow a storage cell to be written to via a plurality of different write paths. Column selects are built into each storage cell by adding an additional isolating switch between the storage node of the storage cell and the bitline of a particular write path in order to prevent a cell write from affecting other storage cells connected to the same wordline in the same interleaved array. The write data bus corresponding to each write path for all interleaved cells are shared by all storage cells in a common interleave group, and each adjacent pair of storage cells in a common row share bitlines coupled to the common data bus, resulting in smaller number of required bitlines.

22 Claims, 5 Drawing Sheets

MULTI-PORT STATIC RANDOM ACCESS MEMORY DESIGN FOR COLUMN INTERLEAVED ARRAYS

FIELD OF THE INVENTION

The present invention relates generally to the field of memory devices, and more particularly to a multiple write port static random-access memory (SRAM) with built-in column interleave support.

BACKGROUND OF THE INVENTION

Static random access memory (SRAM) is an essential component in computer processor based systems. SRAM chips typically include millions of individual storage cells which each store a single digital bit value. Prior art SRAM cells have typically been single-ported, meaning that the cell may be read from and written to via a single write path. Recently, however, multi-port SRAM cells have become common in applications that require multiple data transfers into and out of memory during a single machine cycle, and in applications where the data to be stored comes from several different sources. Typical applications for multi-port SRAM arrays include high-speed general purpose registers used in a central processing unit (CPU), and high-speed cache memories used in instruction and data memory management. Multi-port SRAMs have n data input/output (I/O) ports and allow n separate data transfers during a single read or write cycle.

SRAMs are generally implemented as an array of individual storage cells. In the most basic SRAM array, the number of rows matches the number of addressable words in the memory and the number of columns matches the number of bits in each word. In this configuration, a wordline mapped to a given address activates a pair of pass gates of each storage cell in the addressed row to couple the respective storage cell to a different respective bitline. For read operations, a wordline for a given word is activated, and the stored data bit from each storage cell is coupled via the cell's enabled pass gates onto the storage cell's respective bitlines. In write operations, data is coupled onto the each of the respective bitlines and the wordline corresponding to the addressed word is activated to enable the cell's pass gates to couple the data present on the bitlines into each of the respective storage cell in the addressed row. In this addressing scheme, each bitline is coupled to every cell in a given column. In large SRAM arrays, this configuration results in very long bitlines, and therefore longer storage cell access time. Accordingly, modern SRAM arrays use column interleaving in order to provide a more square array configuration, and therefore minimize the bitline length and storage cell access time.

Column interleaving is also employed to reduce bit error rates by distributing each bit of a given word across different areas of the array. Generally speaking, storage cells within the same area of an SRAM chip are each susceptible to common corruption events. Storage cell corruption often occurs, for example, as a result of an electrostatic discharge (ESD) event or by bombardment of an alpha-particle. These events affect a much larger area of the chip than is occupied by a single storage cell. Accordingly, by interleaving memory bits across different portions of the memory chip, the probability that a number of adjacent bits in the same word experience corruption from the same event is reduced. Thus, if a corruption event occurs, generally only a single or a small few bits in any given word become corrupted. The column interleaving technique allows standard error correction techniques, such as parity checking and error correction code (ECC), to be used to recover each corrupted byte or word when a corruption event occurs because only a single or few bits are likely to become corrupted at any given time.

SRAMs are word-addressable, meaning that all storage cells that store a bit in a common word are accessed simultaneously. In a multiple write port SRAM array, bits in any given word may be accessed via different write ports of each storage cell. Each write port of each storage cell is activated by an independent wordline signal. Accordingly, because a single wordline signal activates the write ports of as many SRAM cells as there are bits in the word, if any bit is read from a different port than any of the other bits in the word (e.g., when different bits in a given word are to be written to from different sources or during different clock cycles and hence via different write ports), the write ports of some cells may be activated even though no data is actually being written to that cell via that port. This is referred to in the art as a "dummy read". Dummy reads, due to the additional charge placed on the storage node of the storage cell as a result of pre-charging the bitlines, often results in unintended flipping of the value stored by storage cells performing a dummy read. Accordingly, for stability reasons, multi-port SRAMs are generally implemented using differential circuit techniques, which require two bitlines and two access transistors to write a storage cell rather than one bitline and one access transistor for single-ended storage cells.

In the prior art SRAM cells, each additional write port requires an additional differential pair of bitlines and another set of associated bitline selection circuitry. The penalty for adding additional write ports to a storage cell in an SRAM is thus a large increase in the size of the SRAM circuitry.

A need exists for a multiple write port single-ended SRAM cell that minimizes the number of bitlines, selection circuitry, and storage cell components required in implementing the SRAM.

SUMMARY OF THE INVENTION

The present invention achieves all of these goals by providing a single-ended multiple write port SRAM design with built-in column selects. According to the invention, column select switches are built into each SRAM cell so that a write to a given cell no longer affects the other cells connected to the same wordline in the column interleaved arrays. Desirable SRAM cell noise margin is also easily achieved. The write data lines for all interleaved cells are shared by a single data line, resulting in smaller number of required bitlines.

The SRAM chip is partitioned into a plurality of column interleave groups, one for each bit in a memory word. Each column interleave group includes a plurality of storage cells arranged in columns.

Each storage cell includes a storage node on which a bit value is stored and a plurality of write ports corresponding to the number of different write paths from which the storage cell may be written. Each write port of a storage cell is coupled to write selection circuitry that is responsive to a respective wordline select signal and a respective column select signal to switchably connect the bitline to the cell's storage node. The write selection circuitry associated with each write port in a given storage cell is controlled by a different respective wordline select signal but an identical column select signal. The write selection circuitry associated with each write port that resides in the same column receives an identical respective column select signal. The write selection circuitry is implemented in the preferred embodiment using a pair of series coupled n-channel field effect transistors (NFETs) that together are coupled between the cell's input port and the respective write bitline that it is serving. One of the series connected NFETs is controlled by the wordline select signal and the other is controlled by the column select signal.

BRIEF DESCRIPTION OF THE DRAWING

The invention will be better understood from the following detailed description of the presently preferred exemplary embodiment of the invention taken in conjunction with the accompanying drawing in which like reference numbers indicate identical or functionally equivalent elements, and in which.

DETAILED DESCRIPTION

Figure 1:
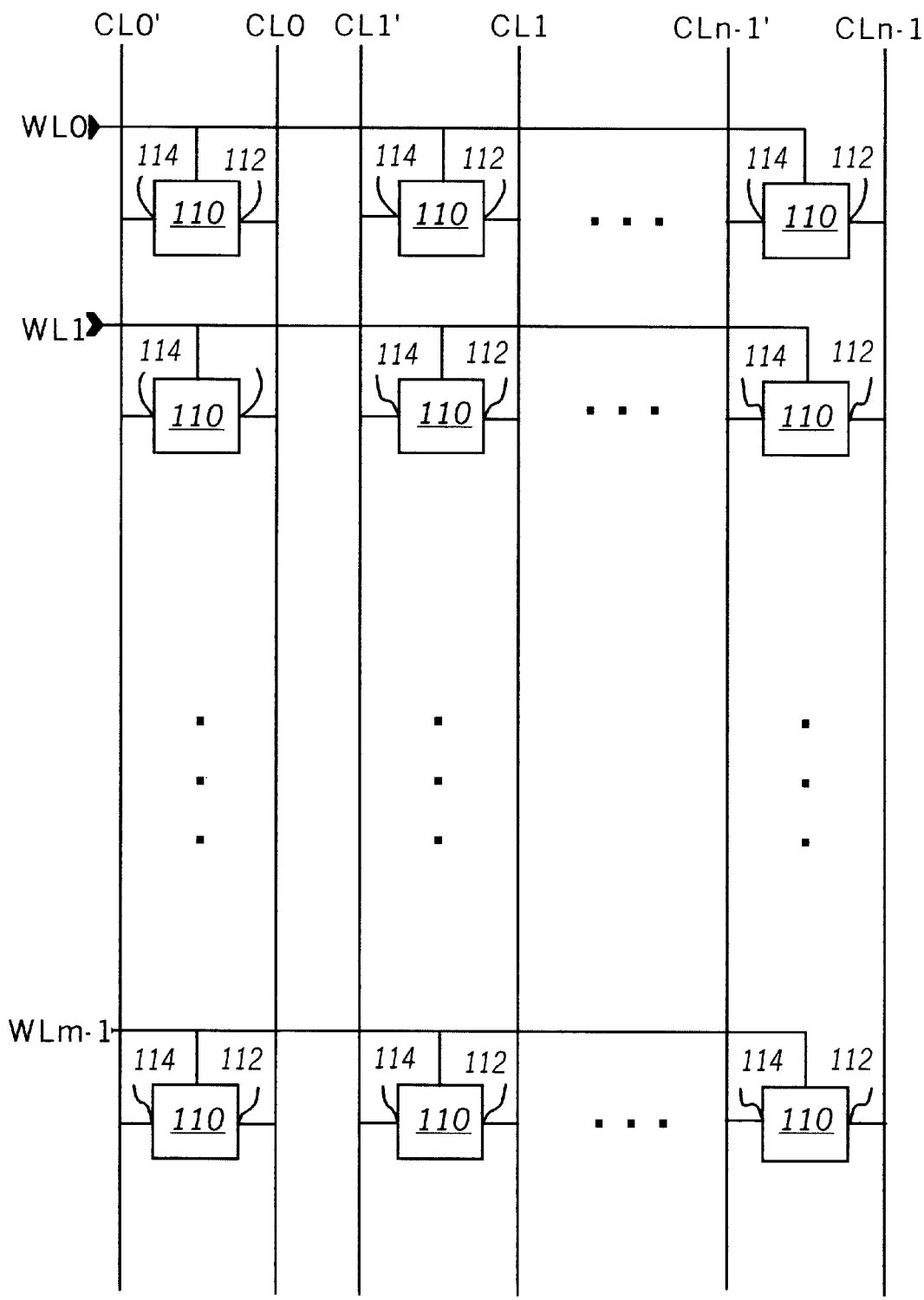
FIG. 1 is a block diagram of a prior art SRAM array.
Figure 2:
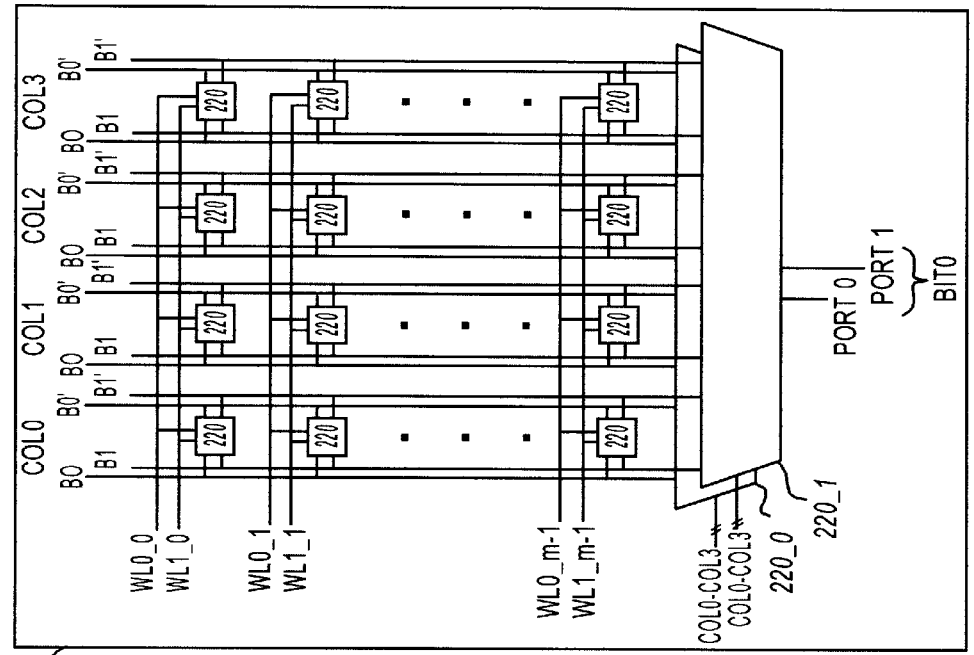
FIG. 2 is a schematic diagram of a portion of a prior art column-interleaved memory array.
Figure 2:
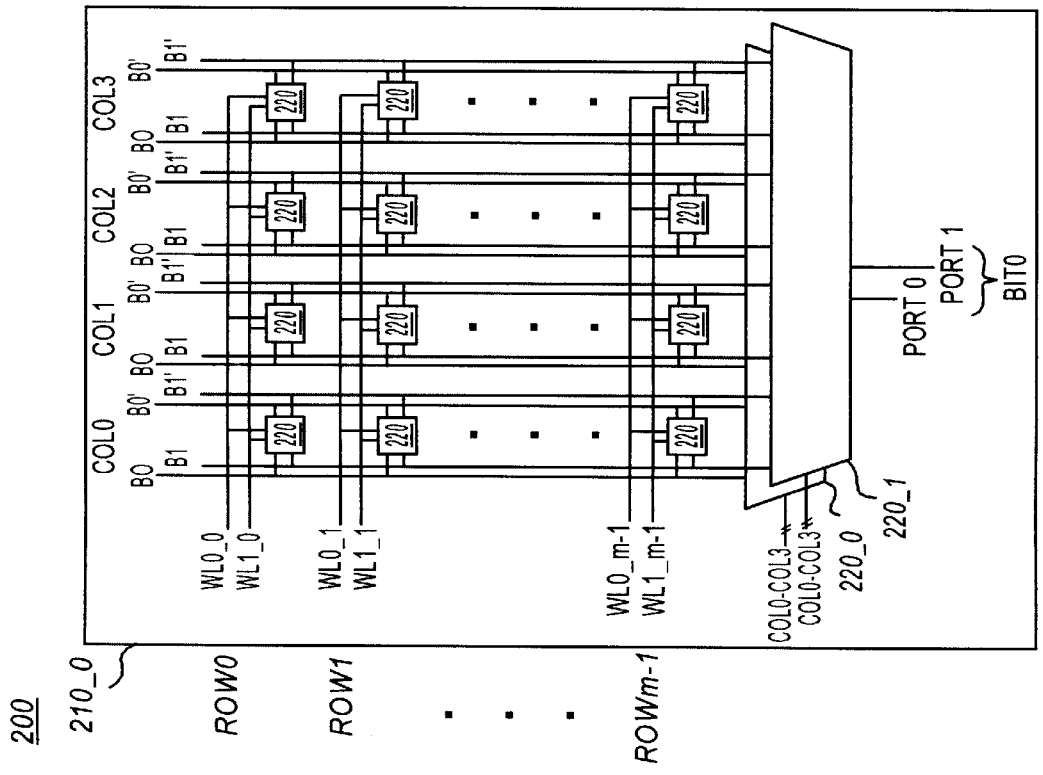
Figure 3:
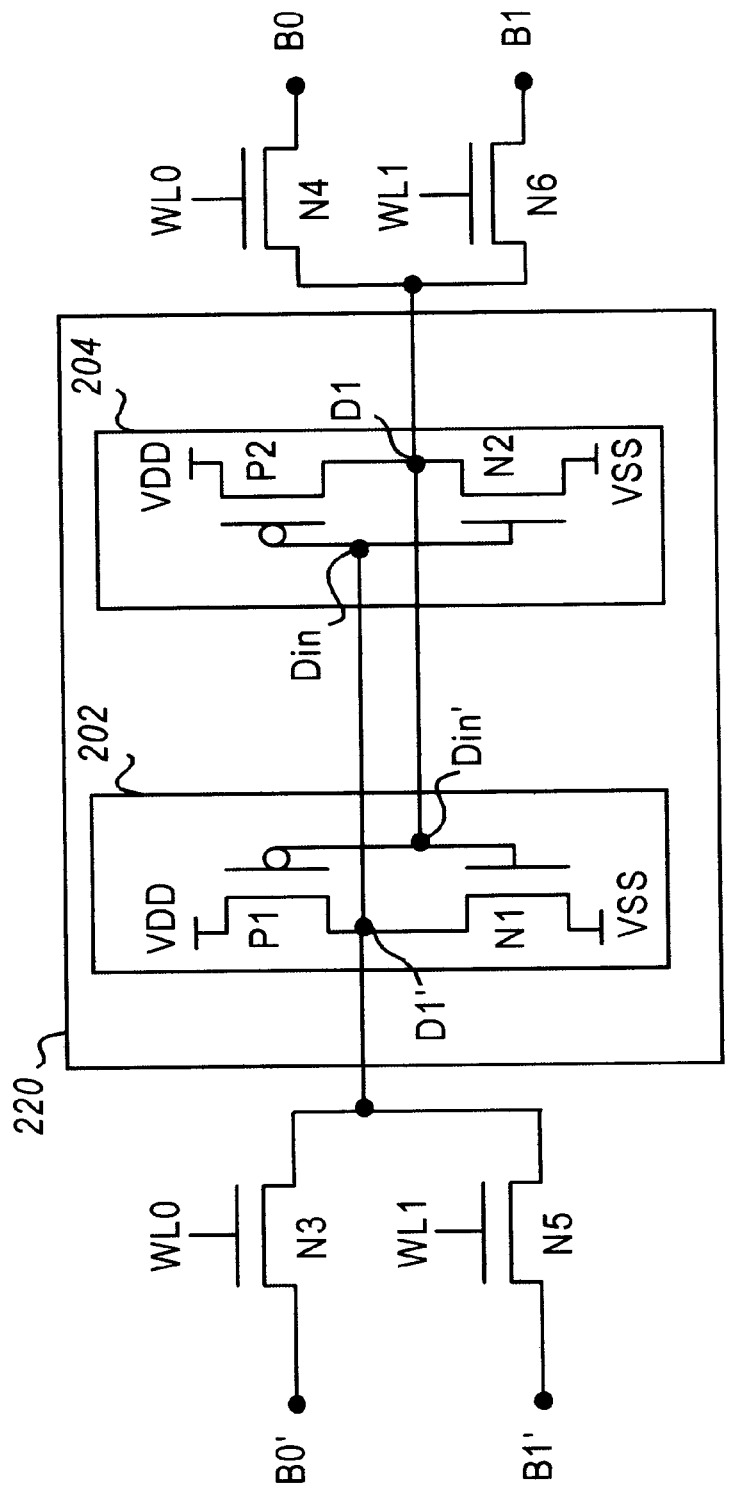
FIG. 3 is a schematic diagram of a prior art multi-port storage cell.

The novel features of the present invention will be better understood with reference to the prior art, as illustrated in FIGS. 1 through 3. FIG. 1 is a block diagram of a conventional m-by-n SRAM array 100. Array 100 includes a plurality of storage cells 110 arranged in m rows and n columns. Each storage cell 110 holds a bit value, which is characterized by operation in one of two mutually-exclusive and self-maintaining operating states. Each operating state defines one of the two possible binary bit values, zero or one. The conventional prior art SRAM array 100 is implemented using differential circuit techniques. Each storage element 100 is provided with a pair of differential input/output (I/O) ports 112, 114, referred respectively herein as a driving I/O port 112 and an inverse I/O port 114, which at any given time maintain voltage levels that are inverse to one another.

Each storage cell 110 lying in the same column shares a common differential bitline pair CL and CL', shown (for columns 0–n) as CL0 and CL0' through CLn–1 and CLn–1'. Each storage cell 110 is responsive to a word line signal WL, shown positionally as WL0 through WLm–1, to couple differential input/output ports 112, 114 of the storage cell 110 to its column's respective differential bitline pair CL and CL'. Column select circuitry (not shown) selects the differential bitline pair CL and CL' of the particular cell that is to be read or written. Word select circuitry (not shown) activates the word line signal WL of the desired storage cell 110. In the simplest embodiment, each bit in a word lies in the same row in the array of cells. In other configurations, each bit in a given word lies in different areas of the SRAM array in order to reduce bit error rates. Reading a particular storage cell 110 involves activating the desired storage cell's wordline signal WL to connect the cell's respective differential I/O ports 112, 114 to its corresponding column lines CL and CL'. Writing to a desired storage cell 110 involves first placing selected complementary logic voltages on the cell's respective column lines CL and CL', and then activating the cell's wordline signal WL to connect those logic voltages to the cell's respective I/O ports 112, 114. This forces the outputs to the selected logic voltages, which are maintained as long as power is supplied to the storage cell, or until the storage cell is rewritten.

FIG. 2 is a schematic diagram of a portion of a column interleaved multiple write port SRAM array. The storage cells are shown identically at 220. FIG. 2 assumes an n-bit word, where each bit in the n-bit word is located in a different one of a plurality of interleave groups $210_{13}$ 0 through $210_{13}$ n–1. Each cell 220 supports two write ports, enabled respectively by wordlines W0 and W1.

FIG. 3 is a schematic diagram of a conventional multiple write port storage cell 220, illustrating a two write port implementation. Storage cell 220 generally comprises first and second inverters 202 and 204 which are cross-coupled to form a bistable flip-flop. Inverters 202 and 204 are formed by n-channel driver transistors N1 and N2, and p-channel load transistors P1 and P2.

The source regions of driver transistors N1 and N2 are tied to a low reference or circuit supply voltage, labeled VSS, which is typically the circuit ground. Load transistors P1 and P2 are connected in series between a high reference or circuit supply voltage, labeled VDD, and the drains of the corresponding driver transistors N1 and N2. The gates of load transistors P1 and P2 are connected to the gates of the corresponding driver transistors N1 and N2.

Inverter 202 has an inverter output D1' formed by the drain of driver transistor N1 and drain of load transistor P1. Similarly, inverter 204 has inverter output D1 formed by the drain of driver transistor N2 and drain of load transistor P2.

Inverter 202 has inverter input D1' formed by the gate of driver transistor N1 and gate of load transistor P1. Inverter 204 has inverter input formed by the gate of driver transistor N2 and gate of load transistor P2.

The inputs and outputs of inverters 202 and 204 are cross-coupled to form a flip-flop having a pair of complementary two-state outputs. Specifically, inverter output D1' is cross-coupled to inverter input Din, and inverter output D1 is cross-coupled to inverter input Din'. In this configuration, inverter outputs D1 and D1' form the complementary two-state outputs of the flip-flop.

A first write port is implemented using a pair of access transistors N3 and N4. Access transistor N3 has one active terminal connected to cross-coupled inverter output D1'. Access transistor N4 has one active terminal connected to cross-coupled inverter output D1. Complementary bitline pairs B0 and B0' are respectively connected to the active terminals of respective access transistors N3 and N4. First write port access transistors N3 and N4 are switched on by a first wordline signal WL0 to couple differential bitlines BL0 and BL0' to inverter outputs D1 and D1'.

A second write port is implemented using a pair of access transistors N5 and N6. Access transistor N5 has one active terminal connected to cross-coupled inverter output D1'. Access transistor N6 has one active terminal connected to cross-coupled inverter output D1. Complementary bitline pairs B1 and B1' are respectively connected to the active terminals of respective access transistors N5 and N6. Second write port access transistors N5 and N6 are switched on by a first wordline signal WL1 to couple differential bitlines BL1 and BL1' to inverter outputs D1 and D1'.

Storage cell 220 is written to via the first write port by first placing selected complementary logic voltages on column lines B0 and B0', and then activating wordline signal WL0 to connect those logic voltages to inverter outputs D1 and D1'. This forces the outputs D1 and D1' to the selected logic voltages, which are maintained as long as power is supplied to the cell 220, or until storage cell 220 is rewritten. Storage cell 220 is written to via the second write port by first placing selected complementary logic voltages on column lines B1 and B1', and then activating wordline signal WL1 to connect those logic voltages to inverter outputs D1 and D1'.

Storage cell 220 is said to be bistable because it has two stable or self-maintaining operating states, corresponding to two different output voltages. Without external stimuli, storage cell 220 will operate continuously in a single one of its two operating states. It has internal feedback to maintain a stable output voltage, corresponding to the operating state of the storage cell 220, as long as it continues to receive power. The two possible output voltages produced by storage cell 220 correspond generally to upper and lower circuit supply voltages, VDD and VSS. Intermediate output voltages, between the upper and lower circuit supply voltages VDD and VSS, generally do not occur except for during brief periods of storage cell 220 power-up and during transitions from one operating state to the other operating state.

The conventional SRAM design employs differential circuit techniques in order to provide higher noise immunity and cell stability than a single-ended cell design. In a single-ended storage cell design, a cell is read or written via a single column line and a single access transistor. However, the single-ended storage cell design is problematic. If a given storage cell is accessed only from side of the storage cell, e.g., D1 in cell 220, via a single access transistor, e.g., N4 or N6, a read operation of the cell 220 when the cell is storing a logic low level (i.e., a "0"), exposes the stored value to instability. Because bitlines B0 and B1 are precharged high, when access transistor N4 or N6 is turned on during a dummy read operation, charge accumulates on Din', which may cause inverter 202, and therefore, inverter 204 to flip, thus flipping the stored value held on D1 of cell 220 from a logic low level (i.e., a "0") to a logic high level (i.e., a "1"). To avoid this undesirable effect, two things are typically done. First, the sizes of NFETs N2, N4 and N6 are designed such that the charge accumulated on D1 during a read operation is insufficient to cause inverter 202 to flip. Meeting this condition makes it impossible to write a logic high level (i.e., a "1"). Second, the input to inverter 204 is simultaneously coupled to a differential bitline B0' or B1' respectively, which are also precharged high. During a read operation, this helps maintain I/O port D1 at a logic high level (i.e., a "1") in order to prevent inverter 204 from flipping. During a write operation of a logic high level (i.e., a "1") on D1, differential bitline B0' or Bi' are driven to a logic low level (i.e., a "0") to simultaneously couple I/O port D1' to a logic low level.

Turning back to FIG. 2, the two write ports of each storage cell 220 are respectively activated by wordlines WL0 and WL1 to respectively couple their I/O ports to differential bitlines B0, B0' or B1, B1'. It is shown from the configuration of FIG. 2 that each different bit of a word comes from a different 4-way column interleave group 210_13_0 through 210_n−1 of SRAM 200. Each column interleave group 210_ through 210_n−1 lies in a different portion of SRAM 200 in order to reduce adjacent-bit errors. Each cell 220 in SRAM 200 may be written to via either port 0 or port 1. For example, suppose it is desired to write the cell in each interleave group 210_13_0 through 210_n−1 located in Row 0, Column 3 via Port 0, and, simultaneously, the cell in each interleave group 210_ through 210_n−1 located in Row m, Column 0 via Port 1. Wordline WL0_0 activates the corresponding write ports of cells 220 located in columns COL0, COL1 and COL2 in each interleave group 210_0 through 210_n−1 even through no data is being written to those cells. Likewise wordline WL1_m activates the corresponding write ports of cells 220 located in columns COL 1, COL2 and COL3 in each interleave group 210_0 through 210_n−1 even through no date is being written to those cells. It is clear from this example that because any given wordline WL0_x or WL1_x activates an identical port of each storage cell 220 in the same row x, dummy reads cannot be avoided using the configuration of the prior art SRAM. A storage cell 220 may experience a dummy read from as many write ports as it has. Accordingly, a two write port cell configured as shown in FIG. 3 can potentially experience two dummy reads at once. As described in the background section, the more simultaneous dummy reads a cell experiences, the more charge accumulates on the I/O port D1 of the storage cell 220, making it increasingly difficult to design the cell within acceptable noise margin requirements.

In addition to the difficulty in maintaining acceptable noise margin limits when adding additional write ports to a storage cell, it will also be appreciated from FIG. 2 that every additional write port requires an additional independent set of differential bitlines and associated column select circuitry. Accordingly, a single write port implementation requires a differential bitline pair B0, B0', and column select circuitry 220_0, such as a 4:1 multiplexer as shown. The addition of a second write port requires another pair of differential bitlines B1, B1' and another column select circuit 220_1. With the addition of more write ports to the storage cells, the implementation requires another pair of bitlines and another column selection circuit for each additional port. Thus, the number of components and required chip area quickly multiplies when additional write ports are added to each SRAM cell.

Figure 4:
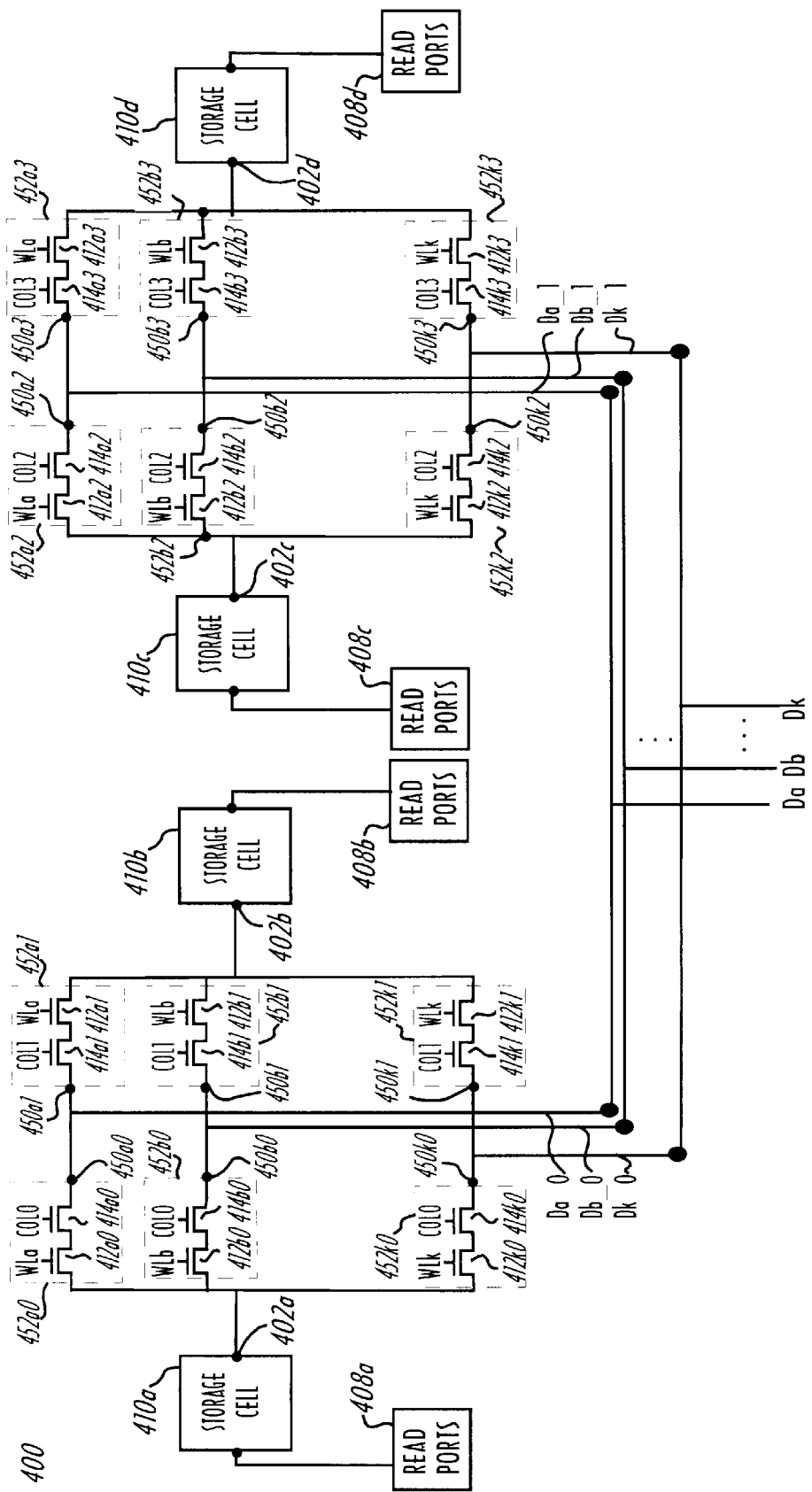
FIG. 4 is a schematic diagram of a row of an interleave group of an SRAM array in accordance with the invention.

FIG. 4 is a schematic diagram of a single 4-way column interleave row 400 of an interleave group of an SRAM array in accordance with the invention. Row 400 includes a plurality of k-port storage cells 410, shown as 410a, 410b, 410c and 410d, each having a storage node 402, shown respectively as 402a, 402b, 402c, 402d. Each cell 410 is coupled to read selection circuitry 408, shown respectively as 408a, 408b, 408c, 408d, that operates to detect and enable a read of its respective storage cell 410. Read selection circuitry 408 may be the same as, or, as illustrated in FIG. 4, implemented independently of the write selection circuitry of the invention. Each storage cell 410 is written to via one of k different write ports, 450a, 450b, . . . , 450k, shown for each cell respectively as 450a0, 450b0, 450c0, 450d0; 450a1, 450b1, 450c1, 450d1y; 450a2, 450b2, 450c2, 450d2; 450a3, 450b3, 450c3, 450d3. Each write port 450a, 450b, . . . , 450k is coupled to a respective independent bitline Da, Db, . . ., Dk. Write ports 450a, 450b, . . . , 450k of each storage cell 410 are coupled to the cell's storage node 402, shown respectively as 402a, 402b, 402c, 402d, via write selection circuitry 452a, 450b, . . . , 450k.

The write selection circuitry 452a, 452b, . . . , 452k for storage cells 410a, 410b, 410c, 410d is shown respectively as 452a0, 452b0, . . . , 452k0; 452a1, 452b1, . . . , 452k1; 452a2, 452b2, . . . , 452k2; and 452a3, 452b3, . . . , 452k3. Write selection circuitry 452a, 452b, 452k receives a wordline signal WLx and a column select signal COLy to determine whether the data present on a given bitline Da, Db, . . . , Dk is transferred to the respective independent write port 450a, 450b, . . . , 450k of a cell 410. In the preferred embodiment, the write selection circuitry is implemented using two series connected NFETs 412 and 414 that are coupled between respective independent bitlines Da, Db, . . . , Dk and respective write ports 450a, 450b, . . . , 450k of a cell 410. Respective independent bitlines Da, Db, . . . , Dk are shared between adjacent storage cells 410a and 410b, and 410c and 410d, respectively. One NFET 412 is controlled by a wordline signal WLx received at its gate, where x represents the port number, and the other NFET 414 is controlled by a column select signal COLy received at its gate, where y represents the column number. The wordline select signal WLx that controls NFET switch 412 is identical for each like write port of each cell 410 in a given row 400. For example, wordline select signal WLa controls NFET 412a0 of write port 450a0, NFET 412a1 of write port 450a1, NFET 412a2 of write port 450a2, and NFET 412a3 of write port 450a3. Likewise, wordline select signal WLb controls respective NFETs 412b0, 412b1, 412b2, and 412b3. Similarly, wordline select signal WLk controls respective NFETs 412k0, 412k1, 412k2, and 412k3. The column select signal COLy that controls NFET switch 414 is different for each NFET switch 414 in a given row 400. For example, column select signal COL0 controls respective NFET switches 414a0, 414b0, 414k0 of respective write ports 450a0, 450b0, 450k0; column select signal COL1 controls respective NFET switches 414a1, 414b1, 414k1 of respective write ports 450a1, 450b1, 450b1; column select signal COL2 controls respective NFET switches 414a2, 414b2, 414k2 of respective write ports 450a2, 450b2, 450k2; and column select signal COL3 controls NFET switches 414a3, 414b3, 414k3 of respective write ports 450a3, 450b3, 450k3. It will be appreciated by those skilled in the art that the positions of NFET switches 412 and 414 may be interchanged and still remain within the scope of the invention. It will also be appreciated that the write selection circuitry 452a, 452b, 452c, 452d may be implemented using p-channel field-effect transistors and complementary logic, or any other known equivalency.

Write selection circuitry is implemented using two series connected NFETs 412 and 414 that are coupled between respective independent bitlines Da, Db, . . . , Dk and respective write ports 450a, 450b, . . . , 450k of a cell 410. Respective independent bitlines Da, Db, . . . , Dk are shared between adjacent storage cells 410a and 410b, and 410c and 410d, respectively. One NFET 412 is controlled by a wordline signal WLx received at its gate, where x represents the port number, and the other NFET 414 is controlled by a column select signal COLy received at its gate, where y represents the column number. The wordline select signal WLx that controls NFET switch 412 is identical for each like write port of each cell 410 in a given row 400. For example, wordline select signal WLa controls NFET 412a0 of write port 450a0, NFET 412a1 of write port 450a1, NFET 412a2 of write port 450a2, and NFET 412a3 of write port 450a3. Likewise, wordline select signal WLb controls respective NFETs 412b0, 412b1, 412b2, and 412b3. Similarly, wordline select signal WLk controls respective NFETs 412k0, 412k1, 412k2, and 412k3. The column select signal COLy that controls NFET switch 414 is different for each NFET switch 414 in a given row 400. For example, column select signal COL0 controls respective NFET switches 414a0, 414b0, 414k0 of respective write ports 450a0, 450b0, 450k0; column select signal COL1 controls respective NFET switches 414a1, 414b1, 414k1 of respective write ports 450a1, 450b1, 450b1; column select signal COL2 controls respective NFET switches 414a2, 414b2, 414k2 of respective write ports 450a2, 450b2, 450k2; and column select signal COL3 controls NFET switches 414a3, 414b3, 414k3 of respective write ports 450a3, 450b3, 450k3. It will be appreciated by those skilled in the art that the positions of NFET switches 412 and 414 may be interchanged and still remain within the scope of the invention. It will also be appreciated that the write selection circuitry 452a, 452b, 452c, 452d may be implemented using p-channel field-effect transistors and complementary logic, or any other known equivalency.

In operation, when both the wordline signal WLx and the column select signal COLy that control a particular write port's write selection circuitry are activated, the data present on the respective bitline Da, Db, . . . , Dkthat is coupled to the respective write selection circuitry is transferred to the storage node 402 of the respective storage cell 410. For example, suppose that data present on bitline Dk is to be written into cell 410d. Cell 410d is located in column 3 and bitline Dk is switchably coupled to write port 450k. Accordingly, signals COL3 and WLk are both activated, and the value on bitline Dk is transferred to the input port 402d of storage cell 410d. In this example, COL3 is activated, and therefore NFET switches 414a3, 414b3, . . . , and 414k3 are all switched on. However, because WLa, WLb, . . . , WL(k-1) are not activated, NFET switches 414a3, 414b3, 414(k-1)3 of write ports 450a3, 450b3, . . . , 450(k-1)3 remain switched off to prevent any dummy reads from taking place on storage cell 410d by isolating bitlines Da, Db, . . . , Dk from storage node 402d of cell 410d. Similarly, WLk is activated, and therefore NFET switches 412k0, 412k1, 412k2, and 412k3 are all switched on. However, because COL0, COL1 and COL2 are not activated, NFET switches 414kO, 414k1, and 414k2 are off, thereby preventing any dummy reads from taking place on storage cells 410a, 410b or 410c by isolating bitline Dk from storage node 402a, 402b, 402c of respective cells 410a, 410b, and 410c. Accordingly, the design of the present invention eliminates any dummy read operations regardless of the number of write ports implemented. Thus, storage cell instability due to the pre-charging of bitlines in combination with dummy reads is no longer an issue, thus eliminating the requirement for a differential logic implementation. Accordingly, a single-ended design is implemented to reduce the number of required bitlines and selection components. In addition, noise level margins are easily achieved regardless of the number of write ports and the size of the FETs used may be smaller than in prior art multi-port SRAMs. Furthermore, according to the invention, as many write ports as desired may be attached to the storage cell without affecting the noise margin.

As illustrated, in the present invention, bitlines and column select circuitry components are shared between multiple storage cells, resulting in reduced chip area. The main data bus Da, Db, . . . , Dk branches between each pair of columns (i.e., between Column 0 and Column 1, labeled as Da_0, Db_0, . . . , $Dk_{13}$ 0, and between Column 2 and Column 3, labeled as Da_1, $Db_{13}$ 1, . . . , $Dk_{13}$ 1). Data bus branches are each shared between storage cells 410a and 410b, and data bus branches Da1, Db1, . . . , Dk1 are each shared between storage cells 410c and 410d. This may be contrasted to the prior art design, which required a separate branch for each column, and two bitlines per write port per branch. The single-ended design of the invention provides adequate stability and noise margin levels, thereby eliminating the requirement for differential logic, and therefore reducing the number of required vertical tracks and hence the amount of required chip area.

Figure 5:
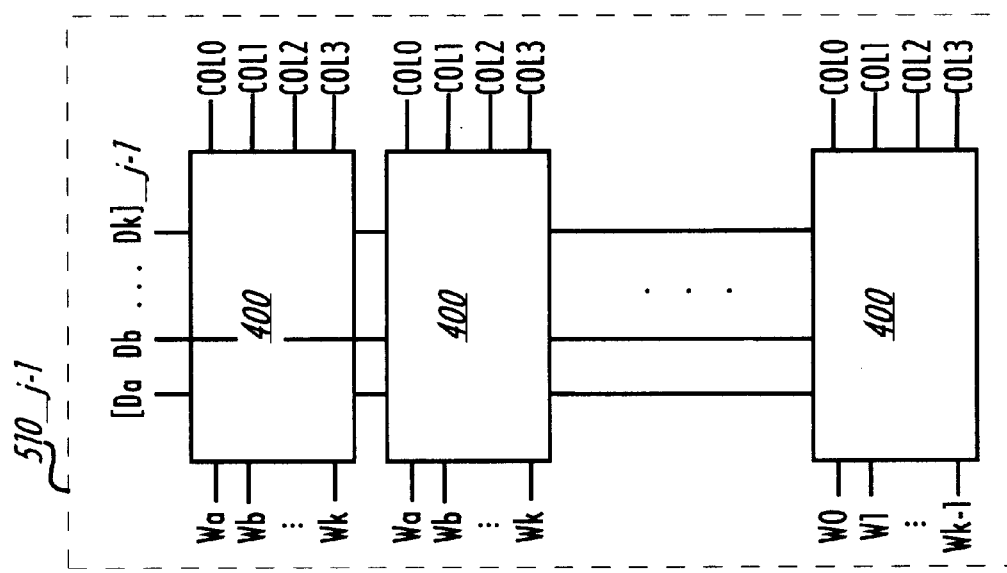
FIG. 5 is a block diagram of a column-interleaved SRAM array in accordance with the invention.
Figure 5:
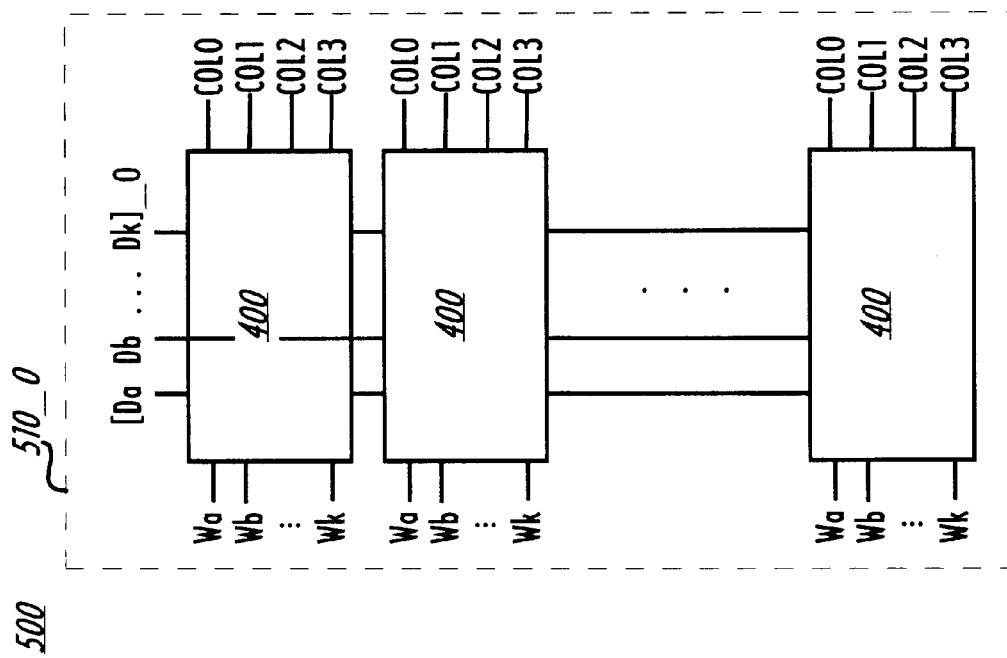

FIG. 5 is a block diagram of an SRAM 500 in accordance with the invention, shown with interleave groups 510_0, ..., 510_j-1 for comparison to the prior art SRAM 200 of FIG. 2. All storage cells in the SRAM of the present invention that are members of the same interleave group 510_0, ..., 510j-1 share a common data bus comprising a set of bitlines, shown respectively as [Da, Db, ..., Dk]_0, ..., [Da, Db, ..., Dk]$_{13}$ j-1. Single-ended writes are implemented, resulting in a dramatic reduction in number of required bitlines over the prior art due to the elimination of the differential multi-port SRAM requirement that each column requires two separate bitlines. Respective bitline paths (i.e., Da$_{13}$ 0, Db_0, ..., Dk_0 and Da_1, Db_1, ..., Dk_1 in FIG. 4) can also be shared by pairs of cells in adjacent columns lying in the same row, and therefore the size of the SRAM chip is further drastically reduced.

While illustrative and presently preferred embodiments of the invention have been described above, it should be understood that the inventive concepts may be otherwise variously embodied and employed and that the appended claims are intended to be construed to include such variations except insofar as limited by the prior art.

What is claimed is:

1. A storage memory, comprising:
    a data bus comprising a plurality of bitlines; and
    a plurality of storage cells, each of said plurality of storage cells comprising:
        a storage node on which a bit value is stored;
        a plurality of write ports, each of said write ports coupled to and corresponding to one each of said plurality of bitlines; and
        a plurality of write selection circuits, one each corresponding to one each of said plurality of write ports and controllable by a respective wordline select signal and a respective column select signal to connect said storage node to said corresponding corresponding write port, wherein each of said plurality of write selection circuits in a respective storage cell receives a different respective wordline select signal and an identical respective column select signal.

2. A storage memory in accordance with claim 1, wherein:
    each of said write selection circuits of each of said plurality of storage cells that are addressable by an identical column select signal are controlled by said identical column select signal.

3. A storage memory in accordance with claim 1, wherein:
    each of said plurality of write selection circuits comprises a first switch controllable by said respective wordline select signal and a second switch controllable by said respective column select signal.

4. A storage memory in accordance with claim 1, wherein:
    each of said plurality of write selection circuits comprises a first FET coupled in series with a second FET between said corresponding bitline and said storage node.

5. A storage memory in accordance with claim 4, wherein:
    said first FET is controllable by said respective wordline select signal and said second FET is controllable by said respective column select signal.

6. A storage memory in accordance with claim 4, wherein:
    said first FET is controllable by said respective column select signal and said second FET is controllable by said respective wordline select signal.

7. A storage memory in accordance with claim 1, wherein:
    said plurality of write ports of each pair of said plurality of storage cells that reside in a like row of said storage memory are coupled to a different respective shared path of said data bus.

8. A storage memory in accordance with claim 7, wherein:
    each of said write selection circuits of each of said plurality of storage cells that are addressable by an identical column select signal are controlled by said identical column select signal.

9. A storage memory in accordance with claim 7, wherein:
    each of said plurality of write selection circuits comprises a first switch controllable by said respective wordline select signal and a second switch controllable by said respective column select signal.

10. A storage memory in accordance with claim 7, wherein:
    each of said plurality of write selection circuits comprises a first FET coupled in series with a second FET between said corresponding bitline and said storage node.

11. A storage memory in accordance with claim 10, wherein:
    said first FET is controllable by said respective wordline select signal and said second FET is controllable by said respective column select signal.

12. A storage memory in accordance with claim 10, wherein:
    said first FET is controllable by said respective column select signal and said second FET is controllable by said respective wordline select signal.

13. A storage memory, comprising:
    a plurality of column interleave groups, each for storing one bit in a word comprising a plurality of bits, each interleave group comprising:
        a data bus comprising a plurality of bitlines; and
        a plurality of storage cells, each of said plurality of storage cells comprising:
            a storage node on which a bit value is stored;
            a plurality of write ports, each of said write ports coupled to and corresponding to one each of said plurality of bitlines; and
            a plurality of write selection circuits, one each corresponding to one each of said plurality of write ports and controllable by a respective wordline select signal and a respective column select signal to connect said storage node to said corresponding corresponding write port, wherein each of said plurality of write selection circuits in a respective storage cell receives a different respective wordline select signal and an identical respective column select signal;
    wherein each respective bit of said word is stored in a respective storage cell positioned in an identical location in each of said interleave groups.

14. A storage memory in accordance with claim 13, wherein:
    each of said write selection circuits of each of said plurality of storage cells that are addressable by an identical column select signal are controlled by said identical column select signal.

15. A storage memory in accordance with claim 13, wherein:
    each of said plurality of write selection circuits comprises a first switch controllable by said respective wordline select signal and a second switch controllable by said respective column select signal.

16. A storage memory in accordance with claim 13, wherein:

each of said plurality of write selection circuits comprises a first FET coupled in series with a second FET between said corresponding bitline and said storage node.

17. A storage memory in accordance with claim 16, wherein:
said first FET is controllable by said respective wordline select signal and said second FET is controllable by said respective column select signal.

18. A storage memory in accordance with claim 16, wherein:
said first FET is controllable by said respective column select signal and said second FET is controllable by said respective wordline select signal.

19. A storage memory in accordance with claim 13, wherein:
said plurality of write ports of each pair of said plurality of storage cells that reside in a like row of said storage memory are coupled to a different respective shared path of said data bus.

20. A storage memory in accordance with claim 19, wherein:
each of said write selection circuits of each of said plurality of storage cells that are addressable by an identical column select signal are controlled by said identical column select signal.

21. A method for writing a data bit value into a storage memory, said storage memory comprising a plurality of storage cells each having a storage node on which a bit value is stored, a plurality of write ports coupled to and corresponding to one each of a plurality of respective bitlines, and a plurality of write selection circuits each associated with one of said respective write ports and each controllable by a different respective wordline select signal and an identical respective column select signal, said method comprising the steps of:

transferring a data bit value present on a respective bitline associated with a respective write port to said respective storage node when both said respective wordline select signal associated with said write selection circuit of said respective write port and said identical respective column select signal are in an enabled state; and isolating said respective bitline associated with said respective write port from said respective storage node when one or the other, or both, of said respective wordline select signal and said identical respective column select signal are in a disabled state.

22. A method in accordance with claim 21, comprising:

controlling a first switch according to an enabled state or disabled state of said respective wordline select signal;

controlling a second switch according to an enabled state or disabled state of said respective column select signal;

forming an electrical connection between said respective bitline associated with said respective write port and said respective storage node through said first switch and said second switch when both said respective wordline select signal and said identical respective column select signal are in said enabled state; and removing said electrical connection between said respective bitline associated with said respective write port and said respective storage node when on or the other, or both, of said respective wordline select signal and said identical respective column select signal are in said disabled state.

* * * * *

UNITED STATES PATENT AND TRADEMARK OFFICE
CERTIFICATE OF CORRECTION

PATENT NO. : 6,282,143 B1
DATED : August 28, 2001
INVENTOR(S) : Zhang et al.

It is certified that error appears in the above-identified patent and that said Letters Patent is hereby corrected as shown below:

<u>Column 6,</u>
Line 63, delete "452a, 452b, 452k" and insert therefore -- 452a, 452b, . . ., 452k --

<u>Column 7,</u>
Line 23, delete "COLO" and insert therefor -- COL0 --
Line 39, delete this entire paragraph beginning with "Write selection circuitry …" and ending with "… any other known equivalency." Column 8, line 9

<u>Column 8,</u>
Line 13, delete "Dkthat" and insert therefor -- Dk that --
Line 23, delete "414a3, 414b3," and insert therefor -- 414a3, 414b3, . . ., --
Line 54, delete "$Dk_{13}\ 0$" and insert therefor -- $Dk\_0$ --
Line 56, delete "$Db_{13}\ 1, ....,Dk_{13}\ 1$)." and insert therefor -- $Db\_1, ..., Dk\_1$). --
Line 58, delete "Da1, Db1, . . ,Dk1" and insert therefor -- $Da\_1, Db\_1, ..., Dk\_1$ --

Signed and Sealed this

Twenty-fifth Day of November, 2003

JAMES E. ROGAN
*Director of the United States Patent and Trademark Office*